(12) United States Patent
Ning et al.

(10) Patent No.: US 9,240,424 B2
(45) Date of Patent: Jan. 19, 2016

(54) THIN FILM TRANSISTOR ARRAY SUBSTRATE AND PRODUCING METHOD THEREOF

(71) Applicant: BOE TECHNOLOGY GROUP CO., LTD., Beijing (CN)

(72) Inventors: Ce Ning, Beijing (CN); Zhijun Lv, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/127,245

(22) PCT Filed: Nov. 21, 2012

(86) PCT No.: PCT/CN2012/084970
§ 371 (c)(1),
(2) Date: Dec. 18, 2013

(87) PCT Pub. No.: WO2013/123786
PCT Pub. Date: Aug. 29, 2013

(65) Prior Publication Data
US 2014/0117372 A1 May 1, 2014

(30) Foreign Application Priority Data

Feb. 23, 2012 (CN) .......................... 2012 1 0043853

(51) Int. Cl.
*H01L 27/12* (2006.01)
(52) U.S. Cl.
CPC ............ *H01L 27/127* (2013.01); *H01L 27/124* (2013.01); *H01L 27/1225* (2013.01); *H01L 27/1288* (2013.01)
(58) Field of Classification Search
None
See application file for complete search history.

(56) References Cited

U.S. PATENT DOCUMENTS

2005/0170565 A1  8/2005  Fujii et al.
2009/0057666 A1  3/2009  Shih et al.
(Continued)

FOREIGN PATENT DOCUMENTS

CN   101226311 A   7/2008
CN   101807583 A   8/2010
(Continued)

OTHER PUBLICATIONS

International Preliminary Report on Patentability for International Application No. PCT/CN2012/084970 dated Aug. 26, 2014, 11pgs.
(Continued)

*Primary Examiner* — Daniel Luke
(74) *Attorney, Agent, or Firm* — Ladas & Parry LLP

(57) ABSTRACT

Disclosed are a thin film transistor array substrate and a producing method thereof in the embodiments of the present invention, the producing method comprising: forming an active layer thin film and a conductive layer thin film on a substrate; depositing a source/drain electrode layer thin film on the conductive layer thin film, treating the conductive layer thin film and the source/drain electrode layer thin film using gray tone or half tone masking process, to form at least two data lines, a pixel electrode and source/drain electrodes of the thin film transistor (TFT); after depositing an insulating layer thin film covered the active layer thin film, the source/drain electrodes, the data lines and the pixel electrode, forming a through hole and a gate insulating layer of the TFT on the insulating layer, to form an active layer of the TFT; forming a gate electrode of the TFT and at least two gate scanning lines cross with the data wires.

11 Claims, 3 Drawing Sheets

(56) References Cited

U.S. PATENT DOCUMENTS

| | | |
|---|---|---|
| 2009/0294772 A1 | 12/2009 | Jeong et al. |
| 2010/0072467 A1* | 3/2010 | Yamazaki et al. ............. 257/43 |
| 2010/0206153 A1 | 8/2010 | Liu |
| 2010/0208153 A1* | 8/2010 | Liu ................................. 349/38 |
| 2010/0283055 A1* | 11/2010 | Inoue et al. .................... 257/59 |
| 2011/0014753 A1 | 1/2011 | Liao et al. |
| 2011/0256684 A1 | 10/2011 | Iwasaki et al. |
| 2013/0069061 A1 | 3/2013 | Nakazawa et al. |

FOREIGN PATENT DOCUMENTS

| | | |
|---|---|---|
| CN | 102629590 A | 8/2012 |
| CN | 102651341 A | 8/2012 |
| KR | 20080082616 A | 9/2008 |
| WO | 2011151970 A1 | 12/2011 |

OTHER PUBLICATIONS

First Office Action (Chinese language) issued by the State Intellectual Property Office ("SIPO") on Oct. 12, 2013 for application No. 201210043853.4, 6 pages.

English translation of first Office action issued by "SIPO" on Oct. 12, 2013 for application No. 201210043853.4, (listed above), 4 pages.

Second Office Action (Chinese language) issued by the State Intellectual Property Office ("SIPO") on Jun. 6, 2014 for application No. 201210043853.4, 3 pages.

English translation of second Office action issued by "SIPO" on Jun. 6, 2014 for application No. 201210043853.4, (listed above), 2 pages.

International Search Report (Chinese language) issued by the International Searching Authority on Feb. 28, 2013 for PCT/CN2012/084970, 15 pages.

English abstract of CN 102629590A, listed above, 1 page.

English abstract of CN 102651341A, listed above, 1 page.

English abstract of CN 101226311A, listed above, 2 pages.

English abstract of CN 101807583A, listed above, 2 pages.

Office Action from Korean Patent Office in corresponding Korean Patent Application No. 10-2014-7000991, issued Mar. 30, 2015; 7 pgs.

English translation of Office Action from Korean Patent Office in corresponding Korean Patent Application No. 10-2014-7000991, issued Mar. 30, 2015; 7 pgs.

English Abstract of KR20080082616A; 1 pg.

English Abstract of WO2011/151970A1; 1 pg.

Extended European Search Report dated Aug. 28, 2015; Appln. No. 12869085.6-1504/2819155 PCT/CN2012084970.

\* cited by examiner

THIN FILM TRANSISTOR ARRAY SUBSTRATE AND PRODUCING METHOD THEREOF

CROSS REFERENCE TO RELATED APPLICATIONS

This application is based on International Application No. PCT/CN2012/084970 filed on Nov. 21, 2012, which claims priority to Chinese National Application No. 201210043853.4 filed on Feb. 23, 2012, the contents of which are incorporated herein by reference.

TECHNICAL FIELD

The present invention relates to a thin film transistor array substrate and a manufacturing method thereof.

BACKGROUND

Currently, usually a flat panel display is used in the field of displays, and the majority of flat panel displays are an AMLCD (Active Matrix Liquid Crystal Display). Existing AMLCD comprises a TFT (thin film transistor) array substrate, as large-area production of a-Si at a low temperature can be easily achieved and the production technology is relatively mature, it is currently a widely used material for manufacturing the TFT array substrate. However, the band gap of the a-Si material is only 1.7 eV, it is opaque to visible light and is photosensitive within the range of the visible light, thus an opaque metal mask plate (black matrix) needs to be added to shield the light, correspondingly the complexity of the production process of the TFT array substrate is increased, then the cost is increased and the reliability and opening rate are lowered. Meanwhile, to obtain enough brightness, the light strength of a light source needs to be enhanced, and correspondingly power consumption is increased. In addition, the mobility of the a-Si material can hardly exceed 1 $cm^2 \cdot V^{-1} \cdot s^{-1}$, thus current TFT array substrates can hardly meet needs of liquid crystal televisions with a continuously increasing size and drive circuits with better performance.

As the a-Si TFT array substrate has the above disadvantages, an oxide semiconductor TFT has been widely paid attention due to its various advantages and has been undergoing fast development during recent years. An oxide semiconductor, being transparent and having a high mobility, fine uniformity and a simple fabrication process, can better meet needs of large-sized liquid crystal displays. Also, the production of the oxide TFT can satisfactorily match current LCD production lines, then the transition is easy, thus people have paid more attention to the oxide TFT which has been a hot research topic recently.

However, the prior art need to use at least 4 masking exposing processes during manufacturing the oxide TFT array substrate, then the production process is very complex and the cost of the mask plate is high, correspondingly the production cost of the product is increased, the yield of the product is lowered, and equipment capacity is decreased.

SUMMARY

One embodiment of the present invention provides a manufacturing method of a thin film transistor array substrate, comprising: forming an active layer thin film and a conductive layer thin film on a substrate; depositing a source/drain electrode layer thin film on the conductive layer thin film, treating the conductive layer thin film and the source/drain electrode layer thin film using a gray tone or half tone masking process, to form at least two data lines, a pixel electrode and source/drain electrodes of a thin film transistor, and the source electrode of the thin film transistor being connected with the data lines; after depositing an insulating layer thin film covering the active layer thin film, the source/drain electrodes, the data lines and the pixel electrode, forming a through hole in the insulating layer thin film and a gate insulating layer, to form an active layer of the thin film transistor, and the through hole being provided at a selected position in the area corresponding to each of the data lines; and forming a gate electrode of the thin film transistor and at least two gate scanning lines crossing with the data lines on the insulating layer, and the gate electrode of the thin film transistor being connected with the gate scanning lines.

Another embodiment of the present invention provides a thin film transistor array substrate, comprising a substrate and a pixel unit array separated by data lines and gate scanning lines crossing with each other, wherein, each pixel unit comprises: an active layer of a thin film transistor on the substrate; a pixel electrode above the active layer of the thin film transistor; data lines and source/drain electrodes of the thin film transistor above the pixel electrode; a gate insulating layer of the thin film transistor covering the data lines and the source/drain electrodes and the active layer of the thin film transistor; and a gate electrode of the thin film transistor on the gate insulating layer of the thin film transistor, wherein, each of the data lines is connected with the source electrodes of a column of thin film transistors, the through hole is provided at a selected position in the area corresponding to each of the data lines, and each of the gate scanning lines is connected with the gate electrodes of a row of thin film transistors.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In view of the problems in the prior of high product cost, low yield and low equipment capacity due to too many times of masking and exposing during manufacturing the TFT array substrate, the embodiment of the present invention provides a manufacturing method of the TFT array substrate, comprising following steps:

S10, forming an active layer thin film and a conductive layer thin film on a substrate;

S11, depositing a source/drain electrode layer thin film on the conductive layer thin film, treating the conductive layer thin film and the source/drain electrode layer thin film using gray tone or half tone masking process, to form at least two data lines, a pixel electrode and source/drain electrodes of the TFT; the source electrodes of a column of TFTs are connected with one data line. For example, the portion of the active layer thin film between the source electrode and the drain electrode forms a channel.

S12, after depositing an insulating layer thin film covering the active layer thin film, the source/drain electrodes and the pixel electrode, forming a through hole in the insulating layer thin film and a gate insulating layer of the TFT, to form an active layer of the TFT; and the through hole is provided at a selected position in the area corresponding to each of the data lines.

S13, forming a gate electrode of the TFT and at least two gate scanning lines crossing with the data lines on the insulating layer, and the gate electrodes of a row of TFTs are connected with one gate scanning line.

After the above four steps, the TFT array substrate is formed. When the TFT array substrate is assembled to a liquid crystal display, one end of all the gate scanning lines is connected to a scan drive circuit through a pin, and one end of all the data lines is connected to a data drive circuit through the through hole. To be clearer, the drawings of the present invention mainly show the section views near the TFT. Therefore, the through hole for the connection between the data lines and the data drive circuit is not illustrated. However, the position of the through hole can be any position as in the prior art, and is not limited in the embodiments of the present invention.

Figure 1:
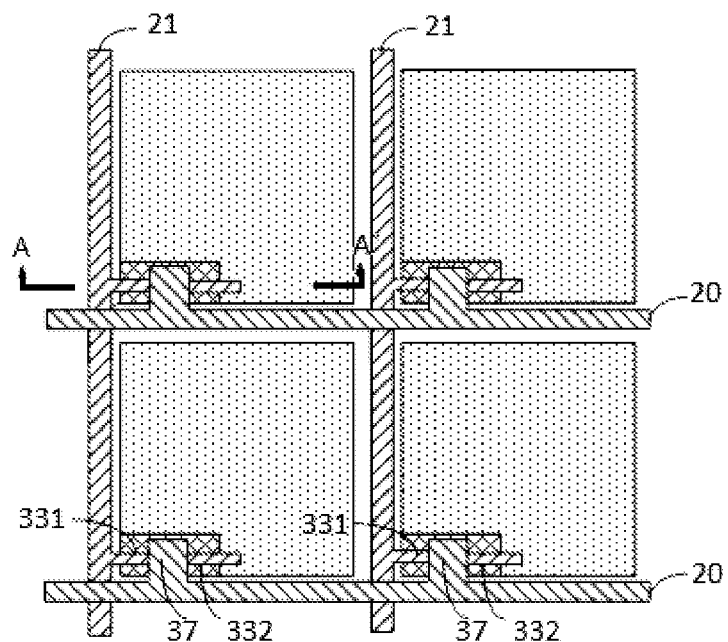
FIG. 1 is a top view of a pixel unit of a TFT array substrate in an embodiment of the present invention.

The TFT array substrate as formed can comprise a plurality of pixel units, and FIG. 1 is a top view of a pixel unit of the TFT array substrate, the horizontally arranged are the parallel gate scanning lines 20, the data lines 21 are arranged to cross with the gate scanning lines 20 (for example, perpendicular to each other), and the area separated by the gate scanning lines 20 and the data lines 21 is a pixel unit. The steps of manufacturing the TFT array substrate of the present invention with 3 mask plates will be detailed hereinafter in combination with FIGS. 2-8, the section view at position A-A' in FIG. 1 is to show the structure of the TFT device, in which the source electrode 331, the drain electrode 332 and the gate electrode 337 of the TFT device are illustrated, and the section view at position A-A' will be described in each step hereinafter.

Figure 2:
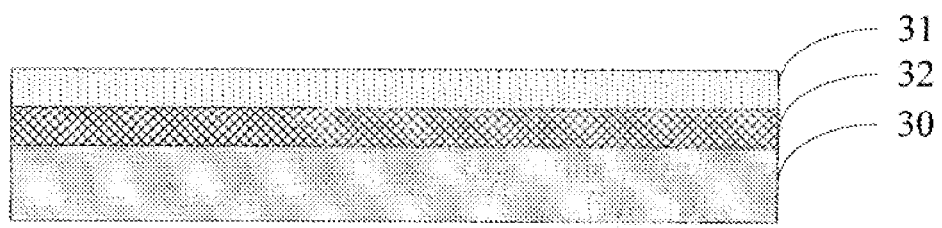
FIG. 2 is a section view of position A-A' after a conductive layer thin film is prepared in the embodiment of the present invention.

As illustrated in FIG. 2, the substrate 30 provided for manufacturing the TFT array substrate can be quartz glass, ordinary glass, plastic substrate and etc. An oxide thin film is deposited on the substrate 30, methods such as magnetron sputtering can be used to deposit ZnO, $In_2O_3$, IGZO and etc., and the thickness of the deposited oxide thin film is, for example, 100-150 nm; surface treatment is conducted to the oxide thin film, after the treatment a layer of conductive layer thin film 31 is formed on the surface of the oxide thin film, and the oxide thin film below the conductive layer thin film that has not been treated is the active layer thin film 32. The surface treatment can be methods such as ion implantation and plasma method. For example, the method of ion implantation can be used to implant metal such as Al and In to the ZnO thin film, the metal Sn can be implanted into the $In_2O_3$ thin film, of course, other metals can also be implanted. The plasma method can also be used to ionize $H_2$ or $N_2$ to plasma, and then the ZnO thin film, the IGZO thin film and etc. are treated. The thickness of the transparent conductive layer thin film 31 formed after the surface treatment is, for example, 50-100 nm.

Thus, the process of manufacturing the active layer thin film and the conductive layer thin film in the above step S10 is completed.

Figure 3:
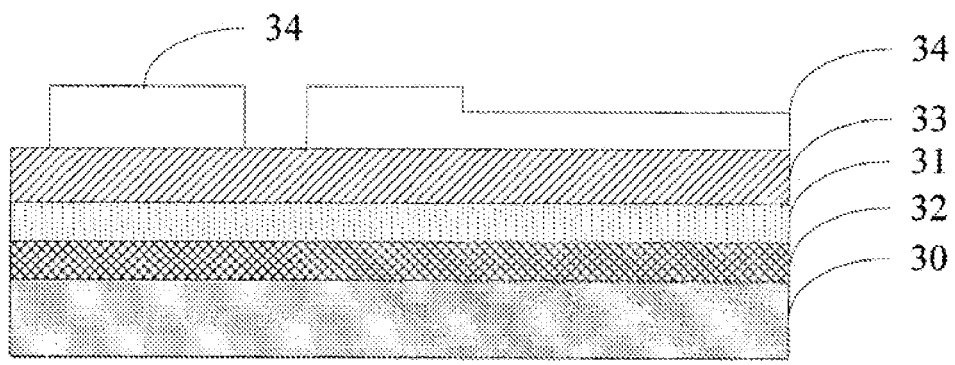
FIG. 3 is a section view of position A-A' after exposing and developing photoresist with a gray tone mask plate in the embodiment of the present invention.
Figure 4:
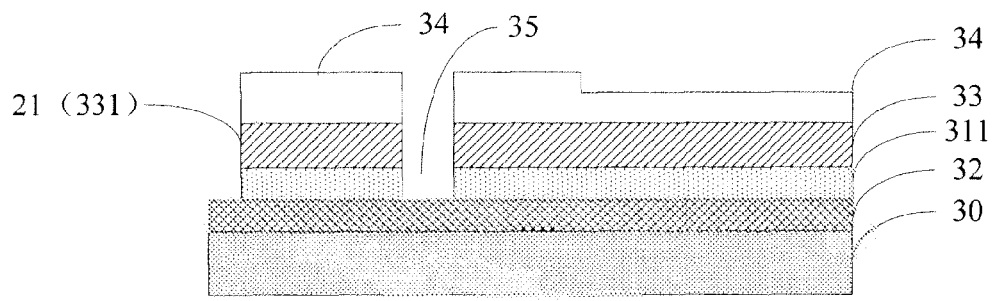
FIG. 4 is a section view of position A-A' after etching the conductive layer thin film and a source/drain electrode layer thin film in the embodiment of the present invention.
Figure 5:
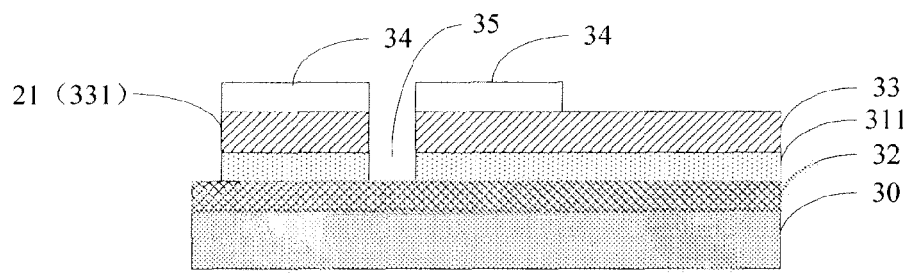
FIG. 5 is a section view of position A-A' after conducting ashing treatment to the photoresist in the embodiment of the present invention.

The First Masking Process:

After depositing the source/drain electrode layer thin film 33 on the conductive layer thin film 31, photoresist is coated on the source/drain electrode layer thin film 33, and a gray tone or half tone mask plate (description is made hereinafter taking the gray tone mask plate as an example), that is, the first mask plate, is used to conduct exposing and developing to the photoresist. The positions corresponding to the data lines, the pixel electrode, the source electrode of the TFT and the channel are not exposed, the position corresponding to the drain electrode of the TFT is partially exposed, and the other positions are completely exposed, thus the conductive layer thin film and the source/drain electrode layer thin film are etched to obtain at least two data lines 21, the pixel electrode 311 and the source electrode 331 of the TFT. The data lines and the source electrode of the TFT are obtained from the source/drain electrode layer thin film and are connected together. The thickness of the deposited source/drain electrode layer thin film is, for example, 200-300 nm, and the material as used can be one of, or the alloy of a plurality of, metals such as Cr, Mo, Ti, Cu or Al, for example, alloy of Mo and Al. FIG. 3 is the section view at position A-A' after the developing; FIG. 4 is the section view at position A-A' after the etching, and at least two data lines 21, the pixel electrode 311 and the source electrode 331 of the TFT are obtained from the etched source/drain electrode layer thin film 33. Ashing treatment is conducted to the exposed and developed photoresist 34, and FIG. 5 shows the section view at position A-A' after the ashing.

Figure 6:
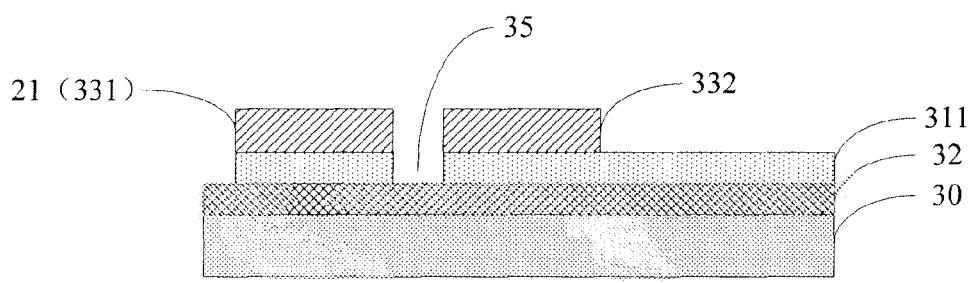
FIG. 6 is a section view of position A-A' after forming the source electrode of a TFT device by etching in the embodiment of the present invention.

The source/drain electrode layer thin film 33 which is exposed after the ashing treatment is etched to obtain the drain electrode 332 of the TFT, and FIG. 6 shows the section view of position A-A' after etching and removing the photoresist subjected to the ashing treatment. The portion in the active layer thin film between the source electrode 331 and the drain electrode 332 forms the channel 35.

Thus, the process of manufacturing the two data lines, the pixel electrode and the source/drain electrodes of the TFT in the above step S11 is completed.

Figure 7:
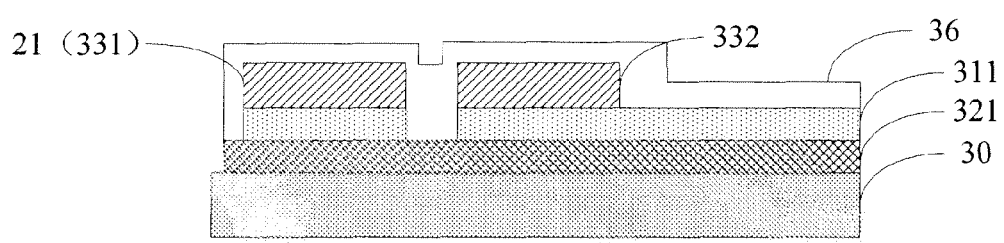
FIG. 7 is a section view of position A-A' after forming a gate insulating layer of the TFT device in the embodiment of the present invention.
Figure 8:
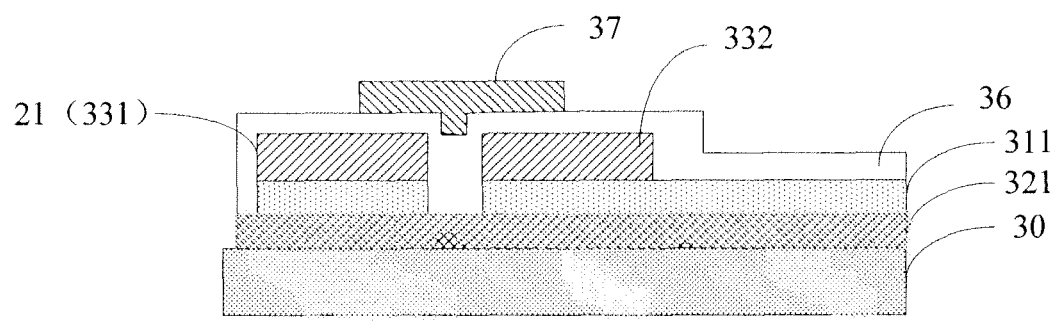
FIG. 8 is a section view of position A-A' after forming a gate electrode of the TFT device in the embodiment of the present invention.

The Second Masking Process:

The insulating layer thin film covering the active layer thin film 32, the source electrode 331, the drain electrode 332, the data lines 21 and the pixel electrode 311 is deposited, the photoresist is coated on the deposited insulating layer thin film, after exposing with mask and developing are conducted to the photoresist with a second mask plate, the insulating layer thin film and the active layer thin film 32 are etched to form the through hole and the gate insulating layer 36 and the active layer 321 of the TFT. Herein the whole active layer thin film is divided into several pieces each of which forms the active layer of the TFT device in one pixel unit. For example, the active layer of the TFT is located within the area separated by the gate scanning lines and the data lines and is distributed within the whole area, that is, it is distributed within the whole area of each pixel unit (as illustrated in FIG. 8). The through hole is provided at the selected position in the area corresponding to each data line, and the data line at the position of the through hole is exposed for connecting the data drive circuit; the selected position is within the data line area, for example, it can be located at the edge position or the central position of the data line area, and a preferable one is the edge position of the data line area. FIG. 7 illustrates the section view of the position A-A' after manufacturing the insulating layer of the TFT device.

There can be many methods for depositing the insulating layer thin film, and two methods are listed as follow: first, a Plasma Enhanced Chemical Vapor Deposition (PECVD) method is used to deposit, for example, an insulating layer thin film of 300-500 nm, and the material can be Silicon Nitride ($SiN_x$), Silicon Oxide ($SiO_x$) and etc.; second, a physical sputtering method is used to deposit, for example, an insulating layer thin film of 300-500 nm, and the material can be Aluminum Oxide ($Al_2O_3$) and etc.

The process of manufacturing the through hole and the gate insulating layer and the active layer of the TFT in the above step S12 is completed with the second mask plate.

The Third Masking Process:

The gate layer thin film is deposited on the insulating layer 36, the photoresist is coated on the gate layer thin film, after exposing with mask and developing are conducted to the photoresist with a third mask plate, the gate layer thin film is etched to form the gate electrode 37 of the TFT and at least two gate scanning lines 20 crossing with the data lines 21. Methods such as magnetron sputtering can be used to deposit, for example, a gate layer thin film of 200-300 nm, and the material as used can be one of, or the alloy of a plurality of, metals such as Cr, Mo, Ti, Cu or Al, for example, alloy of Mo and Al. FIG. 8 is a section view of position A-A' after forming the gate scanning lines and the gate electrode of the TFT device.

The process of manufacturing the gate scanning lines and the gate electrode of the TFT device in the above step S13 is completed with the third mask plate.

Compared with the prior art, the TFT array substrate in the embodiments of the present invention uses one mask plate in manufacturing the data lines, the pixel electrode, and the source/drain electrodes and channel of the TFT, uses one mask plate in manufacturing the through hole, and the gate insulating layer and the active layer of the TFT, and uses one mask plate in manufacturing the gate scanning lines and the gate electrode of the TFT, and the TFT array substrate produced with this method needs 3 mask plates. As the cost of the mask plate is high, this method lowers product cost compared with the array substrate in the prior art that needs at least 4 mask plates. Due to the decrease of the number of the mask plates, corresponding treatment processes are also decreased, then the possibility of product damage is lowered, that is, the product defect rate is lowered, thus the yield and equipment capacity are improved.

Based on the same inventive concept, the embodiments of the present invention provide a TFT array substrate comprising a substrate and a pixel unit array separated by data lines and gate scanning lines crossing with each other, and each data line is connected to the source electrodes of a column of TFTs, a through hole is provided at a selected position in the area corresponding to each data line, and each gate scanning line is connected to the gate electrode of a row of TFTs.

The structure of each pixel unit is illustrated in FIGS. 1 and 8, and FIG. 1 is the top view of a pixel unit, and FIG. 8 is the section view of a pixel unit at position A-A'. Each pixel unit comprises: the active layer 321 of the TFT on the substrate 30; the pixel electrode 311 above the active layer 321 of the TFT and the channel 35 of the TFT; the data lines 21 and the source electrode 331 and the drain electrode 332 of the TFT above the pixel electrode; the gate insulating layer 36 of the TFT covering the data lines 21, the channel 35, and the source electrode 331, the drain electrode 332 and the active layer 321 of the TFT; and the gate electrode 37 of the TFT on the gate insulating layer 36 of the TFT.

Specifically, the active layer of the TFT is located within the areas of the pixel units separated by the gate scanning lines and the data lines and is distributed within the whole area of each pixel unit (as illustrated in FIG. 8).

The embodiments according to the present invention can at least provide following structures and methods:

(1) A manufacturing method of a thin film transistor array substrate, comprising:

forming an active layer thin film and a conductive layer thin film on a substrate;

depositing a source/drain electrode layer thin film on the conductive layer thin film, treating the conductive layer thin film and the source/drain electrode layer thin film using a gray tone or half tone masking process, to form at least two data lines, a pixel electrode and source/drain electrodes of a thin film transistor, and the source electrode of the thin film transistor being connected with the data lines;

after depositing an insulating layer thin film covering the active layer thin film, the source/drain electrodes, the data lines and the pixel electrode, forming a through hole in the insulating layer thin film and a gate insulating layer, to form an active layer of the thin film transistor, and the through hole being provided at a selected position in the area corresponding to each of the data lines; and forming a gate electrode of the thin film transistor and at least two gate scanning lines crossing with the data lines on the insulating layer, and the gate electrode of the thin film transistor being connected with the gate scanning lines.

(2) The method according to (1), wherein, forming the active layer thin film and the conductive layer thin film on the substrate comprises:

depositing an oxide thin film on the substrate; and conducting surface treatment to the oxide thin film so as to form a layer of conductive layer thin film on the surface of the oxide thin film; and the oxide thin film that has not been treated under the conductive layer thin film being the active layer thin film.

(3) The method according to (2), wherein, conducting surface treatment to the oxide thin film comprises:

using an ion implantation method or a plasma method to conduct the surface treatment to the oxide thin film.

(4) The method according to (2) or (3), wherein, a thickness of the deposited oxide thin film is 100-150 nm; and/or a thickness of the conductive layer thin film formed after the treatment is 50-100 nm.

(5) The method according to any one of (1) to (4), wherein, treating the conductive layer thin film and the source/drain electrode layer thin film using the gray tone or half tone masking process to form at least two data lines, a pixel electrode and source/drain electrodes of the thin film transistor comprises:

coating photoresist on the source/drain electrode layer thin film, after exposing and developing the photoresist with a gray tone or half tone mask plate, etching the conductive layer thin film and the source/drain electrode layer thin film, to obtain at least two said data lines, the pixel electrode and the source electrode of the thin film transistor;

conducting ashing treatment to the exposed and developed photoresist; and etching the source/drain electrode layer thin film exposed after the ashing treatment, to obtain the drain electrode of the thin film transistor.

(6) The method according to any one of (1) to (5), wherein, forming the through hole in the insulating layer thin film and the gate insulating layer of the thin film transistor to form the active layer of the thin film transistor comprises:

coating photoresist on the deposited insulating layer thin film, after exposing and developing the photoresist, etching the insulating layer thin film and the active layer thin film, to obtain the through hole and the gate insulating layer and the active layer of the thin film transistor; wherein, the active layer of the thin film transistor is located within an area separated by the gate scanning lines and the data lines and is distributed within the whole area.

(7) The method according to any one of (1) to (6), wherein, a thickness of the deposited insulating layer thin film is 300-500 nm.

(8) The method according to any one of (1) to (7), wherein, forming the gate electrode of the thin film transistor and the at least two gate scanning lines crossing with the data lines on the insulating layer comprises:

depositing a gate layer thin film on the insulating layer; and coating photoresist on the gate layer thin film, after exposing and developing the photoresist, etching the gate layer thin film to obtain the gate electrode of the thin film transistor and the at least two gate scanning lines crossing with the data lines.

(9) The method according to (8), wherein, a thickness of the deposited source/drain electrode layer thin film and/or the gate layer thin film is 200-300 nm.

(10) The method according to any one of (1) to (9), wherein, the thin film transistor is arranged in the form of array, and the source electrodes of a column of the thin film transistors are connected with one of the data lines, and the gate electrodes of a row of the thin film transistors are connected with one of the gate scanning lines.

(11) The method according to any one of (1) to (10), wherein, the active layer thin film is an oxide semiconductor thin film.

(12) The method according to (11), wherein, the material of the oxide semiconductor thin film comprises zinc oxide, indium oxide and indium gallium zinc oxide.

(13) A thin film transistor array substrate, comprising a substrate and a pixel unit array separated by data lines and gate scanning lines crossing with each other, wherein, each pixel unit comprises:

an active layer of a thin film transistor on the substrate;

a pixel electrode above the active layer of the thin film transistor;

data lines and source/drain electrodes of the thin film transistor above the pixel electrode;

a gate insulating layer of the thin film transistor covering the data lines and the source/drain electrodes and the active layer of the thin film transistor; and a gate electrode of the thin film transistor on the gate insulating layer of the thin film transistor, wherein, each of the data lines is connected with the source electrodes of a column of thin film transistors, the through hole is provided at a selected position in the area corresponding to each of the data lines, and each of the gate scanning lines is connected with the gate electrodes of a row of thin film transistors.

(14) The array substrate according to (13), wherein, the active layer of the thin film transistor is located within an area of pixel units separated by the gate scanning lines and the data lines and is distributed within the whole area.

(15) The array substrate according to (13) or (14), wherein, the active layer thin film is an oxide semiconductor thin film.

The foregoing is merely exemplary embodiments of the invention, but is not used to limit the protection scope of the invention. The protection scope of the invention shall be defined by the attached claims.

The invention claimed is:

1. A manufacturing method of a thin film transistor array substrate, comprising:

forming an active layer thin film and a conductive layer thin film on a substrate;

depositing a source/drain electrode layer thin film on the conductive layer thin film, treating the conductive layer thin film and the source/drain electrode layer thin film using a gray tone or half tone masking process, to form at least two data lines, a pixel electrode and source/drain electrodes of a thin film transistor, and the source electrode of the thin film transistor being connected with one of the data lines;

after depositing an insulating layer thin film covering the active layer thin film, the source/drain electrodes, the data lines and the pixel electrode, forming a through hole in the insulating layer thin film, forming a gate insulating layer, and forming an active layer of the thin film transistor, and the through hole being provided at a selected position in the area corresponding to each of the data lines; and forming a gate electrode of the thin film transistor and at least two gate scanning lines crossing with the data lines on the insulating layer, and the gate electrode of the thin film transistor being connected with one of the gate scanning lines, wherein, forming the through hole in the insulating layer thin film, forming the gate insulating layer of the thin film transistor and forming the active layer of the thin film transistor comprises:

coating photoresist on the deposited insulating layer thin film, after exposing and developing the photoresist, etching the insulating layer thin film and the active layer thin film, to obtain the through hole and the gate insulating layer and the active layer of the thin film transistor; wherein, the active layer of the thin film transistor is located within an area whose boundaries are defined by the gate scanning lines and the data lines and is distributed within the whole area.

2. The method according to claim 1, wherein, forming the active layer thin film and the conductive layer thin film on the substrate comprises:

depositing an oxide thin film on the substrate; and conducting surface treatment to the oxide thin film so as to form a layer of conductive layer thin film on the surface of the oxide thin film; and the oxide thin film that has not been treated under the conductive layer thin film being the active layer thin film.

3. The method according to claim 2, wherein, conducting surface treatment to the oxide thin film comprises:

using an ion implantation method or a plasma method to conduct the surface treatment to the oxide thin film.

4. The method according to claim 2, wherein, a thickness of the deposited oxide thin film is 100-150 nm; and/or a thickness of the conductive layer thin film formed after the treatment is 50-100 nm.

5. The method according to claim 1, wherein, treating the conductive layer thin film and the source/drain electrode layer thin film using the gray tone or half tone masking process to form at least two data lines, a pixel electrode and source/drain electrodes of the thin film transistor comprises:
- coating photoresist on the source/drain electrode layer thin film, after exposing and developing the photoresist with a gray tone or half tone mask plate, etching the conductive layer thin film and the source/drain electrode layer thin film, to obtain at least two said data lines, the pixel electrode and the source electrode of the thin film transistor;
- conducting ashing treatment to the exposed and developed photoresist; and
- etching the source/drain electrode layer thin film exposed after the ashing treatment, to obtain the drain electrode of the thin film transistor.

6. The method according to claim 1, wherein, a thickness of the deposited insulating layer thin film is 300-500 nm.

7. The method according to claim 1, wherein, forming the gate electrode of the thin film transistor and the at least two gate scanning lines crossing with the data lines on the insulating layer comprises:
- depositing a gate layer thin film on the insulating layer; and
- coating photoresist on the gate layer thin film, after exposing and developing the photoresist, etching the gate layer thin film to obtain the gate electrode of the thin film transistor and the at least two gate scanning lines crossing with the data lines.

8. The method according to claim 7, wherein, a thickness of the deposited source/drain electrode layer thin film and/or the gate layer thin film is 200-300 nm.

9. The method according to claim 1, wherein, the thin film transistor is arranged in the form of array, and the source electrodes of a column of the thin film transistors are connected with one of the data lines, and the gate electrodes of a row of the thin film transistors are connected with one of the gate scanning lines.

10. The method according to claim 1, wherein, the active layer thin film is an oxide semiconductor thin film.

11. The method according to claim 10, wherein, the material of the oxide semiconductor thin film comprises zinc oxide, indium oxide and indium gallium zinc oxide.

* * * * *